United States Patent
Chen et al.

(10) Patent No.: US 7,208,815 B2
(45) Date of Patent: Apr. 24, 2007

(54) CMOS LOGIC GATE FABRICATED ON HYBRID CRYSTAL ORIENTATIONS AND METHOD OF FORMING THEREOF

(75) Inventors: Hung-Wei Chen, Hsinchu (TW);
Ping-Kun Wu, Hsin-Chu (TW);
Chao-Hsiung Wang, Hsin-Chu (TW);
Fu-Liang Yang, Hsin-Chu (TW);
Chenming Hu, Alamo, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 103 days.

(21) Appl. No.: 10/989,080

(22) Filed: Nov. 15, 2004

(65) Prior Publication Data
US 2006/0049460 A1    Mar. 9, 2006

Related U.S. Application Data

(60) Provisional application No. 60/575,434, filed on May 28, 2004.

(51) Int. Cl.
*H01L 29/04* (2006.01)
(52) U.S. Cl. .................. 257/627; 257/347; 257/371; 257/527; 257/E27.112
(58) Field of Classification Search ............. 257/347, 257/371, 527, 627, E27.112
See application file for complete search history.

(56) References Cited

U.S. PATENT DOCUMENTS 4,857,986 A    8/1989   Kinugawa
4,889,829 A    12/1989  Kawai (Continued)

OTHER PUBLICATIONS

Yang, et al., "5nm-Gate Nanowire FinFET," Symposium on VLSI Technology Digest of Technical Papers (2004) pp. 196-197.

(Continued)

*Primary Examiner*—Andy Huynh
(74) *Attorney, Agent, or Firm*—Slater & Matsil, L.L.P.

(57) ABSTRACT

In preferred embodiments of the present invention, a method of forming CMOS devices using SOI and hybrid substrate orientations is described. In accordance with a preferred embodiment, a substrate may have multiple crystal orientations. One logic gate in the substrate may comprise at least one N-FET on one crystal orientation and at least one P-FET on another crystal orientation. Another logic gate in the substrate may comprise at least one N-FET and at least one P-FET on the same orientation. Alternative embodiments further include determining the preferred cleavage planes of the substrates and orienting the substrates relative to each other in view of their respective preferred cleavage planes. In a preferred embodiment, the cleavage planes are not parallel.

29 Claims, 14 Drawing Sheets

U.S. PATENT DOCUMENTS

| | | |
|---|---|---|
| 5,384,473 A | 1/1995 | Yoshikawa et al. |
| 6,107,125 A | 8/2000 | Jaso et al. |
| 6,580,154 B2 | 6/2003 | Noble et al. |
| 6,657,259 B2 | 12/2003 | Fried et al. |
| 6,902,962 B2 * | 6/2005 | Yeo et al. ............ 438/150 |
| 6,995,456 B2 * | 2/2006 | Nowak .................. 257/627 |
| 2003/0094874 A1 | 5/2003 | Ipposhi et al. |
| 2004/0119100 A1 | 6/2004 | Nowak et al. |
| 2004/0256700 A1 * | 12/2004 | Doris et al. ............ 257/627 |

OTHER PUBLICATIONS

Yang, et al., "On the Integration of CMOS with Hybrid Crystal Orientations," Symposium on VLSI Technology Digest of Technical Papers (2004) pp. 160-161.

Okagaki, et al., "Direct Measurement of Stress Dependent Inversion Layer Mobility Using a Novel Test Structure," Symposium on VLSI Technology Digest of Technical Papers (2004) pp. 120-121.

Yang, et al., "High Performance CMOS Fabricated on Hybrid Substrate With Different Crystal Orientations," IEEE (2003) 4 pages.

Smith, Charles S., "Piezoresistance Effect in Germanium and Silicon," Physical Review, vol. 94, No. 1 (Apr. 1, 1954), pp. 42-49.

* cited by examiner

CMOS LOGIC GATE FABRICATED ON HYBRID CRYSTAL ORIENTATIONS AND METHOD OF FORMING THEREOF

This application claims the benefit of U.S. Provisional Application No. 60/575,434, filed on May 28, 2004 entitled CMOS Logic Gate Fabricated on Hybrid Crystal Orientations and Method of Forming Thereof, which application is hereby incorporated herein by reference.

TECHNICAL FIELD

This invention relates generally to semiconductor fabrication and more particularly to a system and method for device fabrication on multiple crystal orientations.

BACKGROUND

In current CMOS technology, devices generally are made on one specific semiconductor substrate with a single crystal orientation. However, in silicon, electrons have their greatest mobility in the {100} family of planes, while holes have their greatest mobility in the {110} plane family. Generally, one or the other of a P-FET or an N-FET is implemented with the optimum crystal orientation, while the other functions with less than optimal carrier mobility because it is implemented with the same crystal orientation. U.S. Pat. No. 4,857,986 to Kinugawa, which is hereby incorporated herein by reference, describes some of the effects of crystal orientation on carrier mobility.

Accordingly, one problem with the prior art is that the mobility of both electrons and holes is not optimized. Because the mobility of one type of carrier is not optimized, devices may take up more real estate on a substrate in order to meet performance requirements. This larger device footprint generally increases the difficulty of designing system-on-a-chip implementations, which may require a large number of devices on a single chip.

Another problem in the prior art caused by using both P-FETs and N-FETs in a SOI substrate with single crystal orientation generally is potentially severe floating body effect, and the resulting history effect. Moreover, it may increase the difficulty in meeting ESD specifications.

Workers have recognized these problems and have developed techniques for fabricating CMOS devices on hybrid substrates with multiple crystal orientations. For example, U.S. Pat. No. 5,384,473 to Yoshikawa et al., which is hereby incorporated herein by reference, describes a method for fabricating P-FETs on (110) surfaces and N-FETs on (100) surfaces through wafer bonding and selective epitaxy. Yoshikawa et al.'s method is summarized in the following paragraphs and in FIG. 1.

FIGS. 1A to 1G are cross sectional views in the manufacturing sequence of a semiconductor device according to the prior art. First prepared are a single-crystal silicon substrate (wafer) 10 in which the (100) plane comes out to the main surface and a single-crystal silicon substrate (wafer) 12 in which the (110) plane appears at the main surface (FIG. 1A).

Then, as illustrated in FIG. 1B, the substrate 10 is laminated to the substrate 12 by, for example, planishing adhesion techniques to form a silicon body 20.

Next, in FIG. 1C, a mask material 14 is formed on the substrate 10. With the mask material 14 as a mask, the substrate 10 is etched to make an opening 18 that allows the main surface of the substrate 12 to appear at the bottom.

Then, as shown in FIG. 1D, a sidewall 50 made of, for example, a silicon nitride film is formed on the side of the opening 18. This sidewall 50 is created by forming, for example, a nitride film over the substrates 10 and 12, and etching the nitride film by RIE or anisotropic etching techniques to leave a nitride film in the form of a sidewall on the side of the opening 18.

Next, as illustrated in FIG. 1E, by using the mask material 14 as a mask, an epitaxial silicon layer 52 is grown on the substrate 12 exposed at the bottom of the opening 18. The epitaxial silicon layer 52 is formed by a selective epitaxial growth (hereinafter, referred to as SEG) method that uses the substrate 12 as seed crystal. This permits the plane whose surface orientation is the same as that of the main surface of the substrate 12, or the (110) plane to appear at the surface of the epitaxial silicon layer 52. Here, by controlling the thickness of the epitaxial silicon layer 52 to be grown, the surface of the epitaxial silicon layer 52 may be made almost flush with the surface of the substrate 10. Therefore, the silicon body 20 has portions of different surface orientations: a portion with the (100) plane and a portion with the (110) plane. Further, in the body 20 of FIG. 1E, those portions of different surface orientations may be made flush with each other. The mask material 14 is then removed from over the substrate 10.

Then, in FIG. 1F, with a photoresist (not shown) as a mask, p-type impurities are introduced into the substrate 10 with the (100) surface orientation. By using a new photoresist (not shown) as a mask, n-type impurities are then introduced into the epitaxial silicon layer 52 with the (110) surface orientation. Next, the introduced impurities are activated to form a p-type well 22 in the substrate 10, and an n-type well 24 in the epitaxial silicon layer.

Finally, as shown in FIG. 1G, an NMOS 26 is formed in the p-type well 22, and a PMOS 28 is formed in the n-type well 24. This completes the semiconductor device fabrication using hybrid substrates with multiple crystal orientations in accordance with the prior art.

A noted advantage of the hybrid structure shown in FIG. 1G is that it enables the portions of different surface orientations to be almost flush with each other. As a result, there is no step or gap between portions of different surface orientations. This facilitates the connection of semiconductor elements by the interconnection layer. It also eliminates depth of focus problems with lithography. In order to achieve this advantage, it is very important to precisely control the silicon epitaxy 52, FIG. 1E, so that the surface of the epitaxial silicon layer 52 is almost flush with the surface of the substrate 10.

One significant problem commonly encountered in achieving this is the so-called micro-loading effect. This effect stems from variations in transport phenomena across the surface of a patterned wafer. Using etching as an example, the micro-loading effect causes wide trenches to etch more rapidly than narrow trenches. It also causes the open end of a trench to etch more rapidly than the base of a trench. These variations in etch rate are caused by well-known differences in mass and heat fluxes created by the features of the patterned wafer.

The micro-loading effect is also a known problem in chemical mechanical polishing (CMP) used for planarization of wafers. Areas of the wafer that are locally sparse or dense create non-uniformity in the etching/polishing rate. This may cause unacceptable post polish film thickness variation including dishing. Dishing results from an area of lower pattern density polishing faster than an area with a higher pattern density, thus forming a dish-shaped surface.

The micro-loading problem also manifests itself when fabricating FETs on hybrid crystal orientations. In particular, micro-loading can occur during the silicon epitaxy process. This causes wide openings to grow slower than small openings. In order to avoid a step between regions of different crystal orientation, an additional planarization step is required, thereby adding cost and complexity to the process.

What is needed is a method for controlling the micro-loading effect without adding unnecessary complexity or cost.

SUMMARY OF THE INVENTION

These and other problems are generally solved or circumvented, and technical advantages are generally achieved, by preferred embodiments of the present invention in which different crystal orientations may be used for an N-FET and a P-FET in order to optimize the characteristics of the transistors.

In accordance with a preferred embodiment, a substrate may have multiple crystal orientations. One logic gate in the substrate may comprise at least one N-FET on one crystal orientation and at least one P-FET on another crystal orientation. Another logic gate may comprise at least two N-FETs on one crystal orientation and at least two P-FETs on another crystal orientation. Yet another logic gate in the substrate may comprise at least one N-FET and at least one P-FET on the same orientation.

In accordance with another preferred embodiment, an integrated circuit may comprise at least two devices, with the first device on one substrate with a first crystal orientation, and the second device on another substrate with a second crystal orientation.

In accordance with another preferred embodiment, an SOI substrate may comprise a top semiconductor layer and underlying layer (e.g., wafer) with different crystal orientations. Epitaxy may be used to grow one or both of the crystal layers, followed by CMP to achieve a planar surface. Then conventional CMOS processes may be used to form the N-FET and P-FET devices on the layers with different crystal orientations.

In another preferred embodiment, harmful microloading effects are avoided by limiting the active area ratio of largest N-FET region to smallest N-FET region is less than $10^5$.

In yet another preferred embodiment, semiconductor devices include core areas, wherein minimizing device service area is advantageous and non-core areas wherein device service area is a secondary factor. Core devices may preferably have a first plurality of sizes, and non-core devices may preferably have a second plurality of sizes, which may be different from the first plurality of sizes.

Another embodiment is a method orienting transistors on SOI/epi-layer hybrid orientations. The method includes providing a substrate, wherein the substrate has at least a first region and a second region. The first region has a first crystal orientation, and the second region has a second crystal orientation, preferably different from the first crystal orientation. The embodiment further includes determining the preferred cleavage planes of the substrates and orienting the substrates relative to each other in view of their respective preferred cleavage planes. In a preferred embodiment, orienting the substrates relative to each other in view of their respective preferred cleavage planes comprises orienting the substrates so that their preferred cleavage planes are not parallel.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1A:
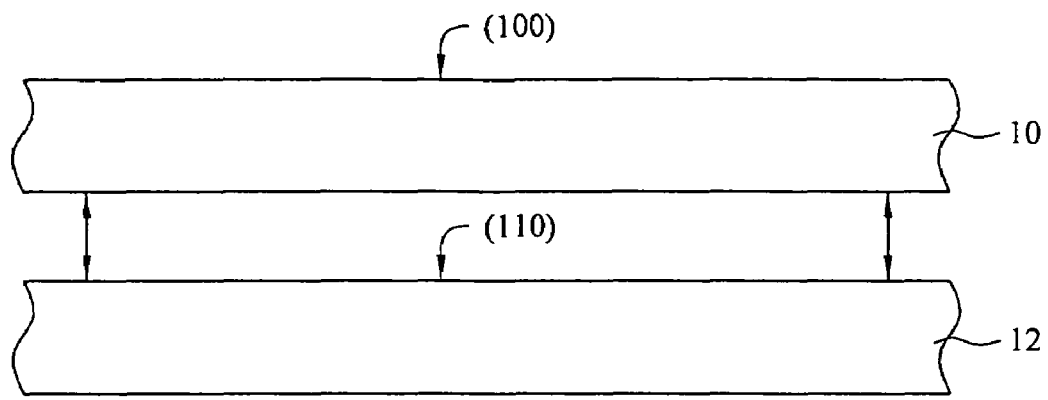
FIGS. 1a–1g are cross sectional views of a prior art method for fabricating a CMOS on a hybrid substrate having multiple crystal orientations.
Figure 1B:
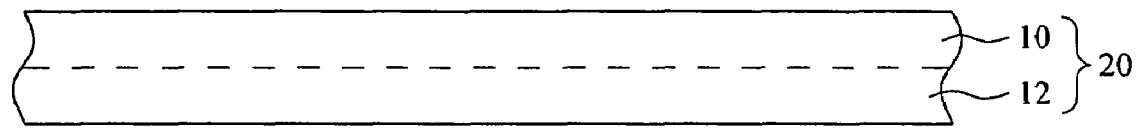
Figure 1C:
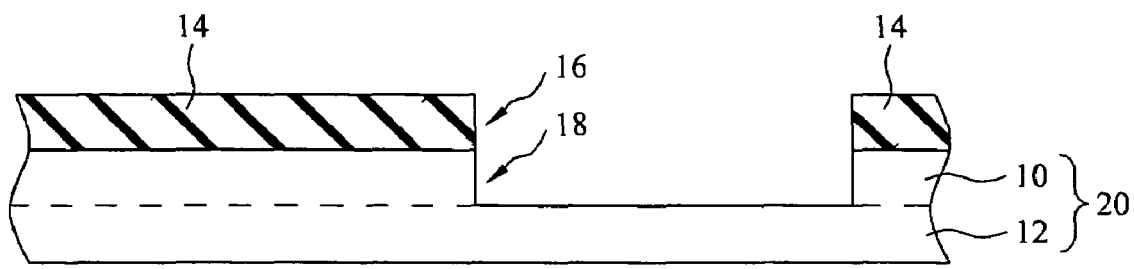
Figure 1D:
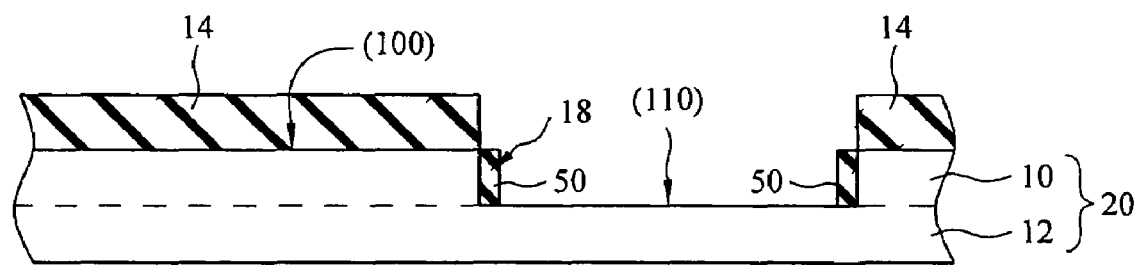
Figure 1E:
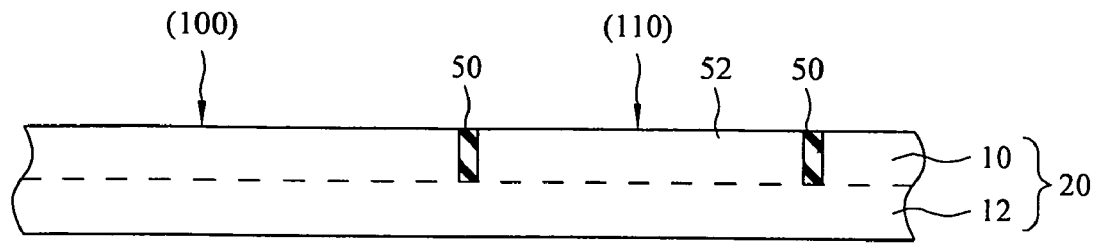
Figure 1F:
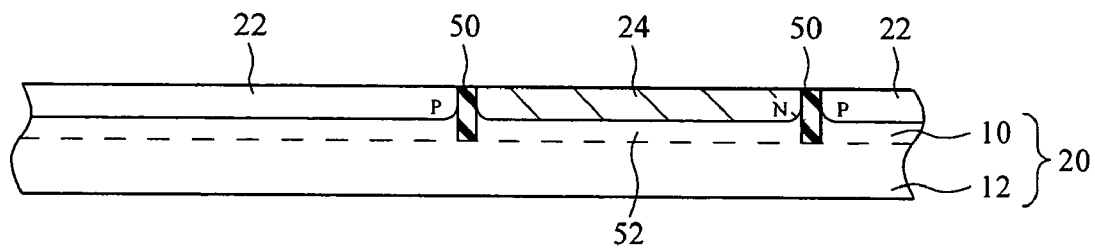
Figure 1G:
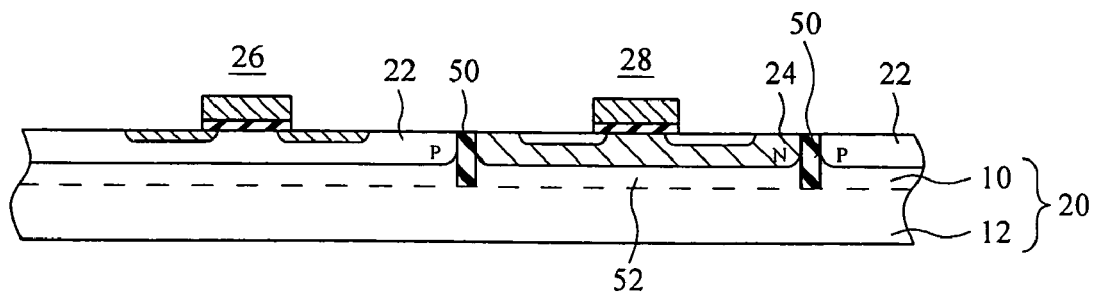

The making and using of the presently preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to preferred embodiments in a specific context, namely CMOS fabrication using SOI and hybrid substrate orientations. The invention may also be applied, however, to other semiconductor devices wherein electrical isolation of neighboring devices is a concern.

U.S. Pat. No. 6,107,125 to Jaso et al., which is hereby incorporated herein by reference, describes the formation of an SOI/bulk hybrid substrate using wafer bonding. U.S. Pat. No. 4,889,829 to Kawai, which is hereby incorporated herein by reference, describes the formation of transistors in the SOI and bulk regions of a semiconductor device. In a paper entitled, *High Performance CMOS Fabricated on Hybrid Substrate with Different Crystal Orientations*, which is hereby incorporated herein by reference, Yang et al., describe a process using SOI technology with multiple orientations.

Generally, a primary building block in ULSI circuits is a CMOS logic gate, comprising at least one N-FET and at least one P-FET. A silicon-on-insulator substrate may be used to implement a CMOS logic gate with different crystal orientations for the P-FET and the N-FET to provide optimum hole and electron mobility. Devices may be either planar or multiple gate devices such as trigate, or FinFET. One advantage of a preferred embodiment is that the real estate of the logic gate may be reduced when carrier mobility is increased. Accordingly, significant real estate on the entire semiconductor chip may be saved by optimizing the crystal orientations to improve carrier mobility. In addition, the manufacturing cost may be effectively reduced. Another advantage of a preferred embodiment is that the floating body effect is alleviated.

With reference now to FIGS. 2a–2h, there are illustrations of the manufacturing sequence according to preferred embodiments of the present invention.

FIGS. 2a–2h show a cross sectional view of a standard silicon on insulator (SOI) structure that has been wafer bonded to a silicon substrate in accordance with prior art methods cited herein. The SOI structure is between about 2 to 200 nm thick, preferably about 40 nm thick. In accordance with preferred embodiments of this invention, FIG. 2a comprises a silicon substrate 202 having a selected first surface orientation and a doping level. Overlaying the substrate is a buried oxide layer, BOX, 204. BOX 204 may have a thickness between about 10 to 200 nm, preferably about 50 nm. Overlaying the BOX 204 is a SOI silicon substrate 206 having a selected second surface orientation and a doping level. Finally, overlaying the SOI silicon substrate 206 is a nitride, hard mask layer 208. Alternative embodiments not illustrated include alternative substrates such as Ge, GaAs, GaAlAs, InP, or GaN.

Figure 2A:
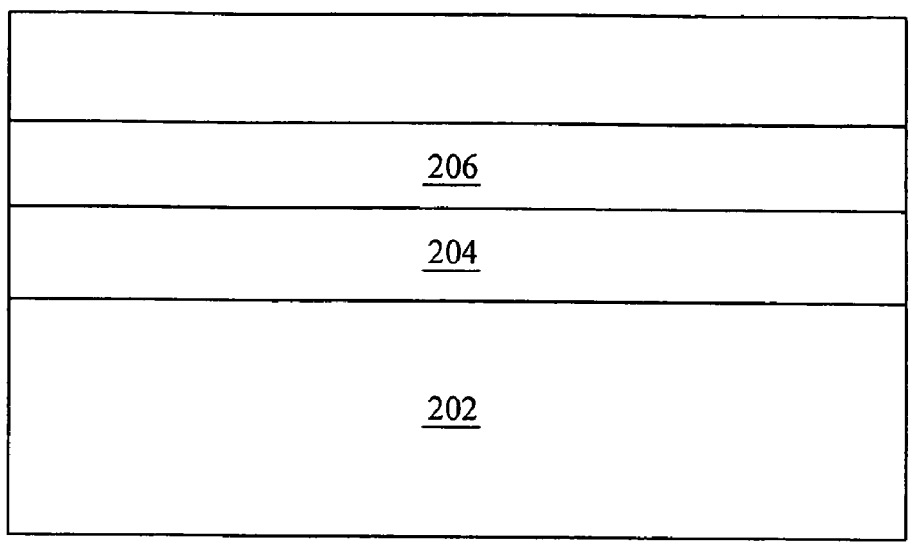
FIGS. 2a–2h are cross sectional views of preferred embodiments of a method for fabricating a CMOS on a hybrid substrate having multiple crystal orientations.
Figure 2B:
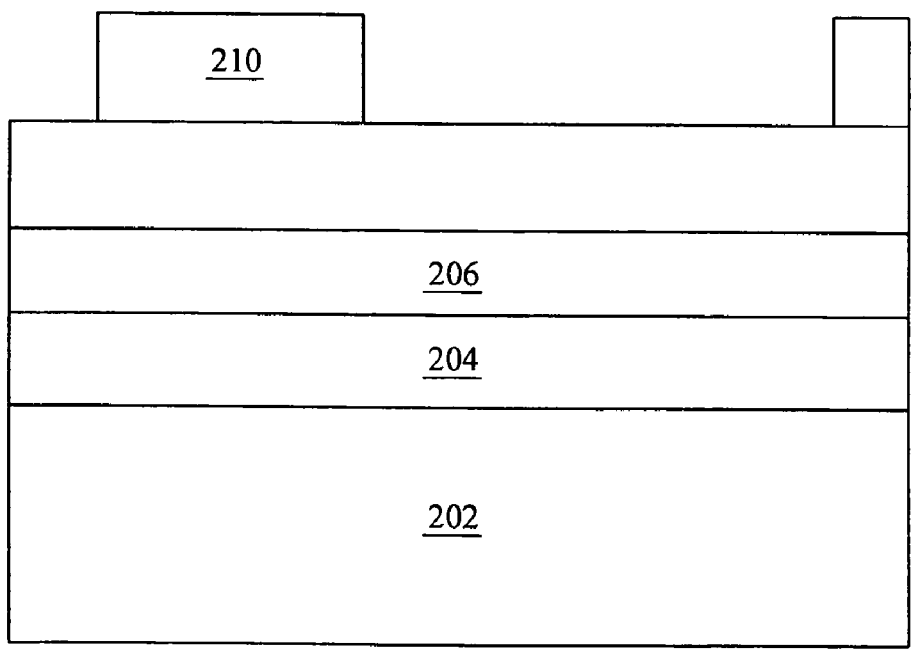
Figure 2C:
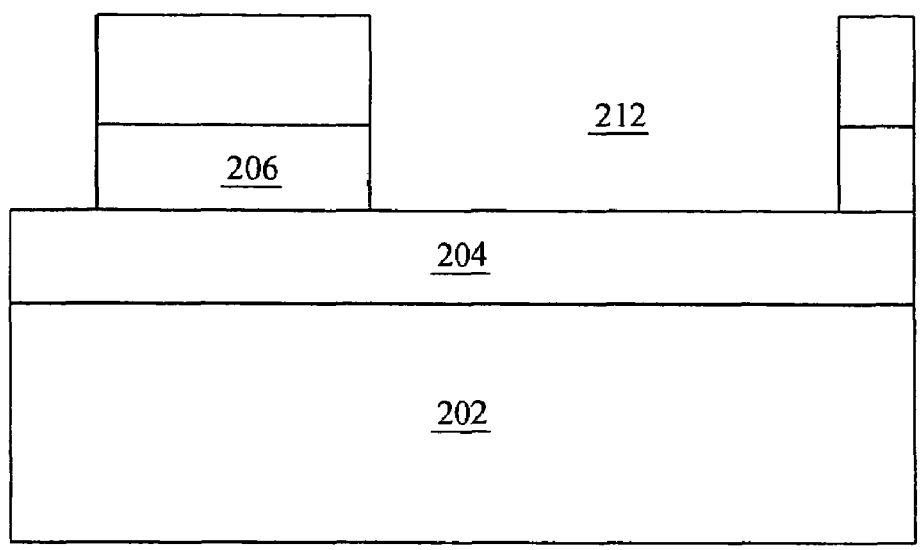
Figure 2D:
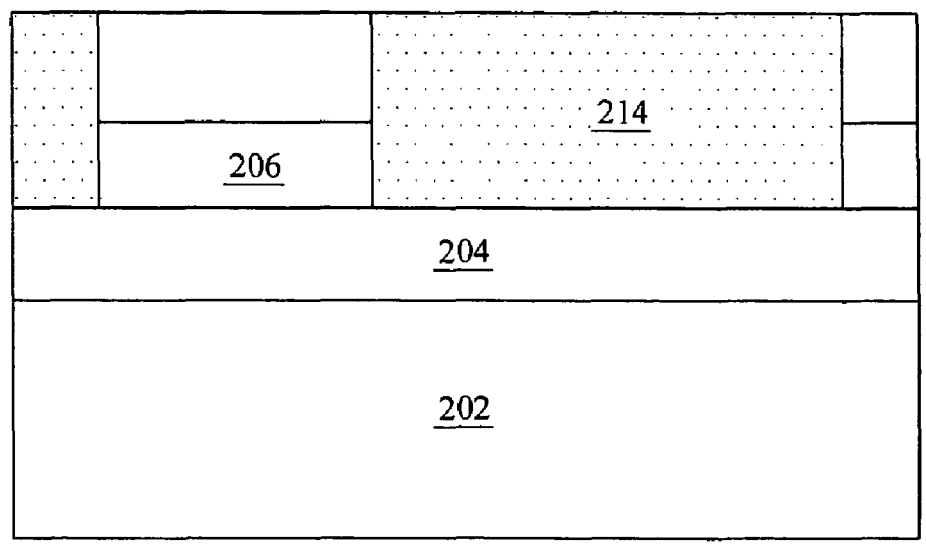

Next, as illustrated in FIG. 2b, a layer of photoresist 210 is applied, patterned, and developed. Openings 212 are made through the nitride 208 and second silicon 206 layers to the buried oxide layer 212, FIG. 2c. The openings are then filled with a suitable isolation insulator 204 such as $SiO_2$ for isolating electrically active regions thereby avoiding shorting contacts, FIG. 2d.

Figure 2E:
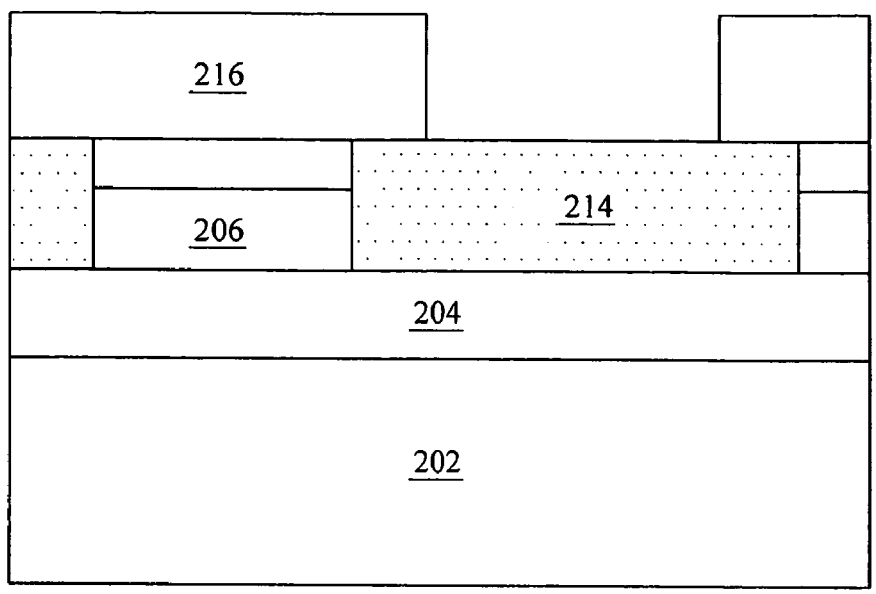
Figure 2F:
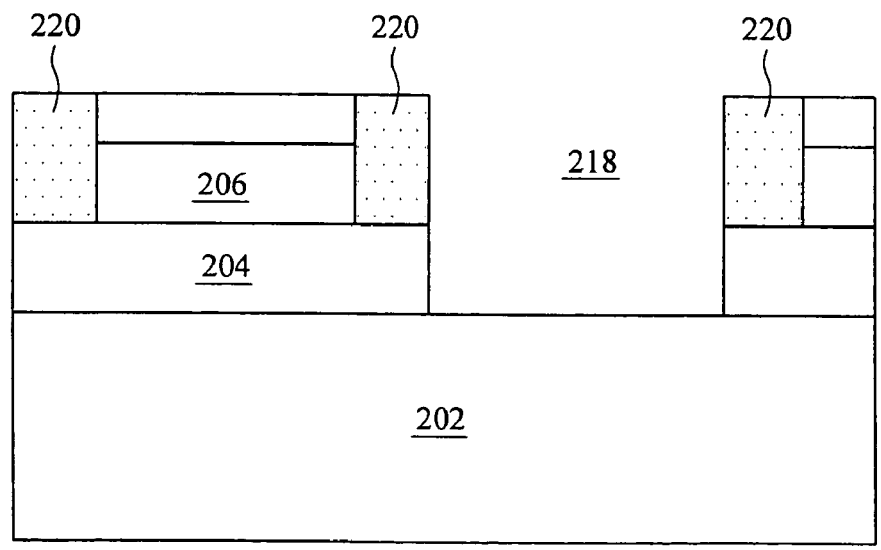

Next, in FIG. 2e, there is an application of a second photoresist layer 216. The second photoresist is patterned and etched, FIG. 2f, and an opening 218 made through selected portions of the isolation insulators 214. As will be discussed in further detail below, the diameter size of opening 218 is important in practicing preferred embodiments of this invention. Portions of the isolation insulator remaining after the step in FIG. 2f function as shallow trench isolation (STI) regions 220 in the finished device.

Figure 2G:
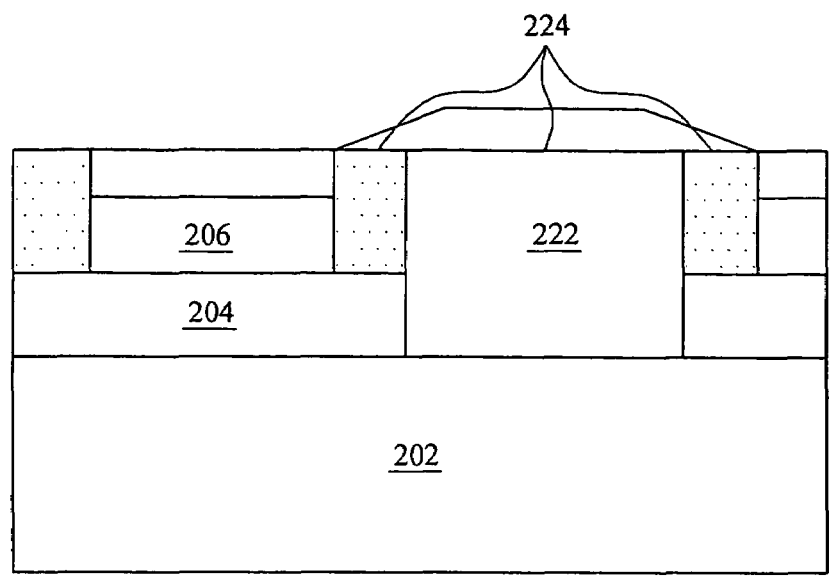

Next, as shown in FIG. 2g, an epitaxial layer 222 of silicon is grown on the silicon substrate 202. The crystal orientation of epitaxial layer 222 is the same as the substrate 202. In accordance with preferred embodiments, control of the epitaxial process is important. As illustrated in FIG. 2g, if the epitaxy is process is not properly controlled, the epitaxial layer has a tendency to laterally overgrow regions of the device. Epitaxy control is complicated by the micro-loading phenomena whereby openings 218 having a larger size tend to grow slower than those having a smaller opening. Frequently during the epitaxy process, silicon tends to exhibit growth facets, 224, which may further complicate device fabrication.

Figure 2H:
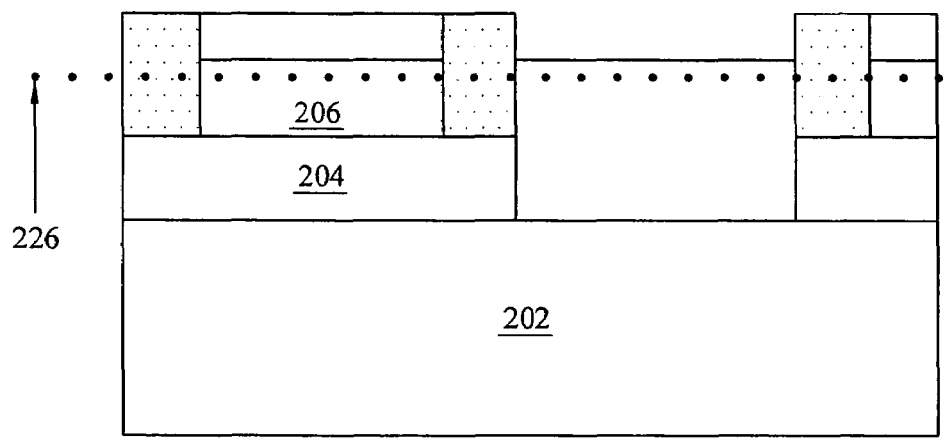

In device fabrication, lateral overgrowth of the epitaxial layer is generally preferably avoided. Consequently, in preferred embodiments of the present invention, epitaxial growth is ended as shown in FIG. 2h. That is, epitaxial growth is stopped before the surface of the epitaxial layer 222 overgrows neighboring device regions. As noted earlier, this result is complicated by the micro-loading effect, which makes control of the epitaxial process more difficult. Next, the multi-layer structure shown in FIG. 2h is chem-mechanical polished to a flush surface 226, thereby forming a substrate having multiple crystal orientations that is suitable for device fabrication.

Applicants have discovered an advantageous means of controlling the micro-loading effect. In an embodiment shown in FIG. 3, epitaxy opening 218 is controlled such that the area of the opening is at least approximately 0.02 $\mu m^2$ when the spacing 228 between two N-FET 230 active regions is less than approximately 0.07 μm. In an alternative, and more preferred embodiment, micro-loading is controlled by limiting the active area ratio of the largest N-FET region to the smallest N-FET region less than $10^5$. Consequently, for next generation 90 nm node technology and beyond, CMOS gate fabrication on hybrid crystal orientations are favorably affected by the device design criteria set forth herein. The deleterious effects of micro-loading are reduced including additional, costly planarization steps.

In describing various embodiments, it is useful to use terminology and nomenclature commonly used in the crystallographic arts. For example, the well-known Miller indices are used herein to describe crystallographic planes and directions. Since some embodiments disclosed herein include silicon, one skilled in the art recognizes that the Miller indices refer to a face-centered cubic crystallographic structure. In keeping with crystallographic nomenclature, one recognizes that [xyz] and (xyz) refer to specific directions and planes respectively and that <xyz> and {xyz} refer to a similarly situated group of directions and planes, respectively. One skilled the art also recognizes that it is sometimes useful to illustrate an embodiment with reference to specific Miller indices. However, reference to specific directions and planes is for exemplary convenience and clarity only. It is not intended to limit an embodiment to a single crystal orientation or a single direction when reference to other members of a similarly situated group would have been equally appropriate.

Figure 3:
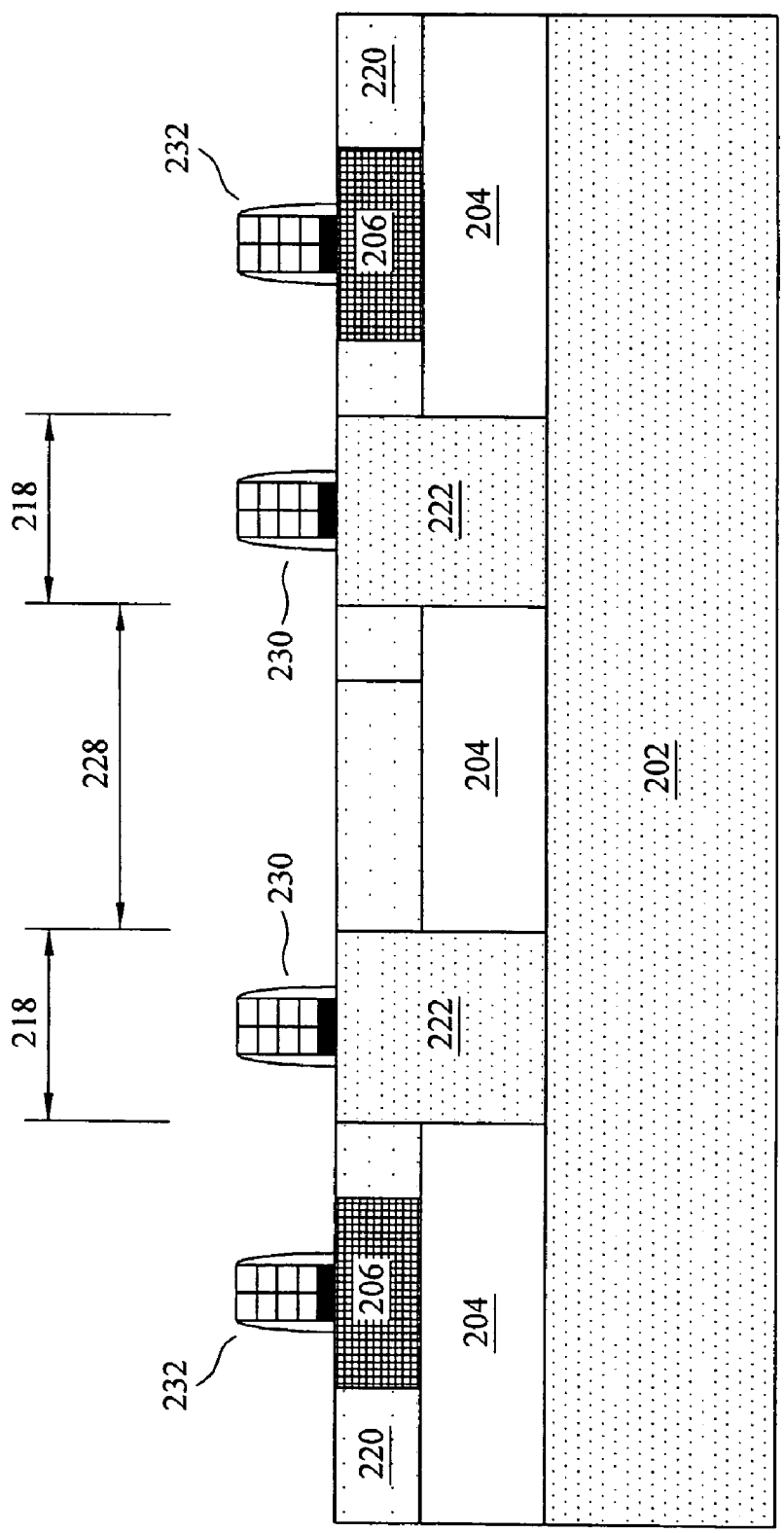
FIG. 3 is a cross sectional view of an embodiment illustrating N-FET spacing.

In further accordance with preferred embodiments, the FET channels (not shown) are oriented along selected crystallographic directions. FET channels are preferably aligned along a crystallographic direction wherein the carrier mobility is optimal. Therefore, in preferred embodiments, it is important that not only crystal orientation be properly selected, but it is also important that the FET channel is properly aligned. Consequently, as illustrated in FIG. 3, a N-FET 230 fabricated on a (100) epilayer 222 preferably has its channel aligned in a <110> direction, i.e. the direction of maximum electron mobility in the (100) plane. Similarly, a P-FET 232 formed on the (110) surface of the SOI silicon substrate 206, preferably has its channel oriented along the <110> direction, which is direction of maximum hole mobility in the (110) plane.

Figure 4A:
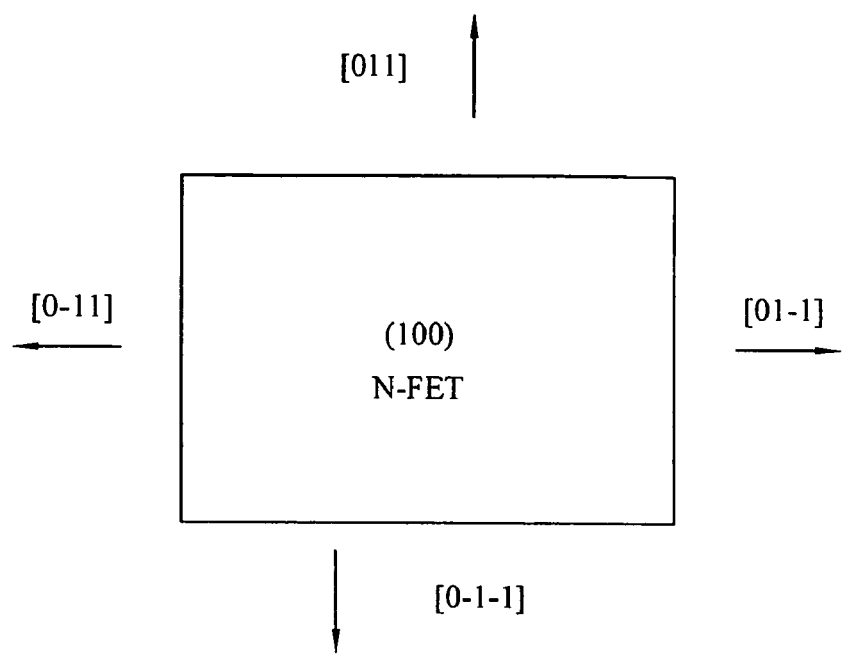
FIGS. 4a and 4b are plan views of preferred embodiments illustrating the directions of maximum carrier mobility relative to wafer surface orientation.
Figure 4B:
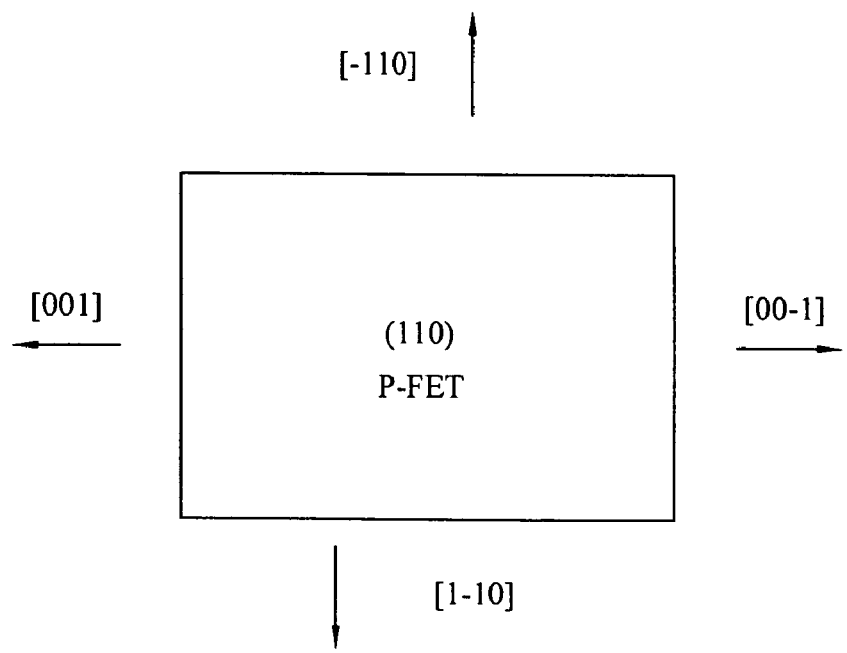

FIGS. 4a and 4b illustrate the relative orientations of the crystal faces and channel directions in preferred embodiments wherein the FET channel lies in the plane of the device. For a (100) surface, there are four <110> directions lying in the plane of the (100) surface, FIG. 4a. For a (110) surface, there are only two <110> directions lying in the (110) plane, FIG. 4b. By carefully orienting both the silicon substrate and the SOI silicon substrate, the channels for both (100) N-FETs and (110) P-FETs are preferably aligned along <110> directions, i.e. the direction wherein each device's respective carrier mobility is maximum.

The preferred embodiment described above and illustrated in FIGS. 4a and 4b includes a N-FET on a (100) epilayer and a P-FET on a (110) surface of a SOI silicon substrate. An alternative embodiment, not shown, comprises a P-FET on a (110) epilayer and a N-FET on a (100) surface of a SOI silicon substrate. Yet another alternative embodiment, wherein maximum carrier mobility is not a primary concern, comprises other epilayer and SOI silicon orientations. For example, an embodiment may comprise a (110) <110> N-FET and a (111)<112> P-FET.

Alternative embodiments may comprise other examples of asymmetric processing. For example, core areas may be reserved for high-speed devices, while non-core areas may be reserved for other devices such as ESD and I/O. Another example of asymmetric processing may involve the gate dielectric.

When using $SiO_2$ as the gate oxide in core areas, devices may have thinner physical gate oxide, but in non-core areas, devices may have a thicker physical gate oxide. This is also true for high-k gate dielectrics. When using a high-k gate dielectric in core areas, devices may have thinner electrical gate oxide thickness, but in non-core areas, devices may have a thicker electrical gate oxide. However, for high-k gate dielectrics, the physical gate oxide thickness in the core area may optionally be equal to or larger than that in the non-core area.

In yet another example of asymmetric, core/non-core processing, single orientation logic gates may be designed for ESD and I/O circuits. The single orientation is preferably implemented in a bulk semiconductor region to provide a path of thermal dissipation and a higher junction breakdown voltage for ESD and I/O circuits. Furthermore, the manufacturing burden would be the same to use either an entire hybrid orientation or a partial hybrid orientation. If core and non-core devices are on a hybrid orientation for the entire wafer, some non-core devices probably will be located on SOI regions, which worsens ESD capability and junction breakdown voltage.

Figure 5A:
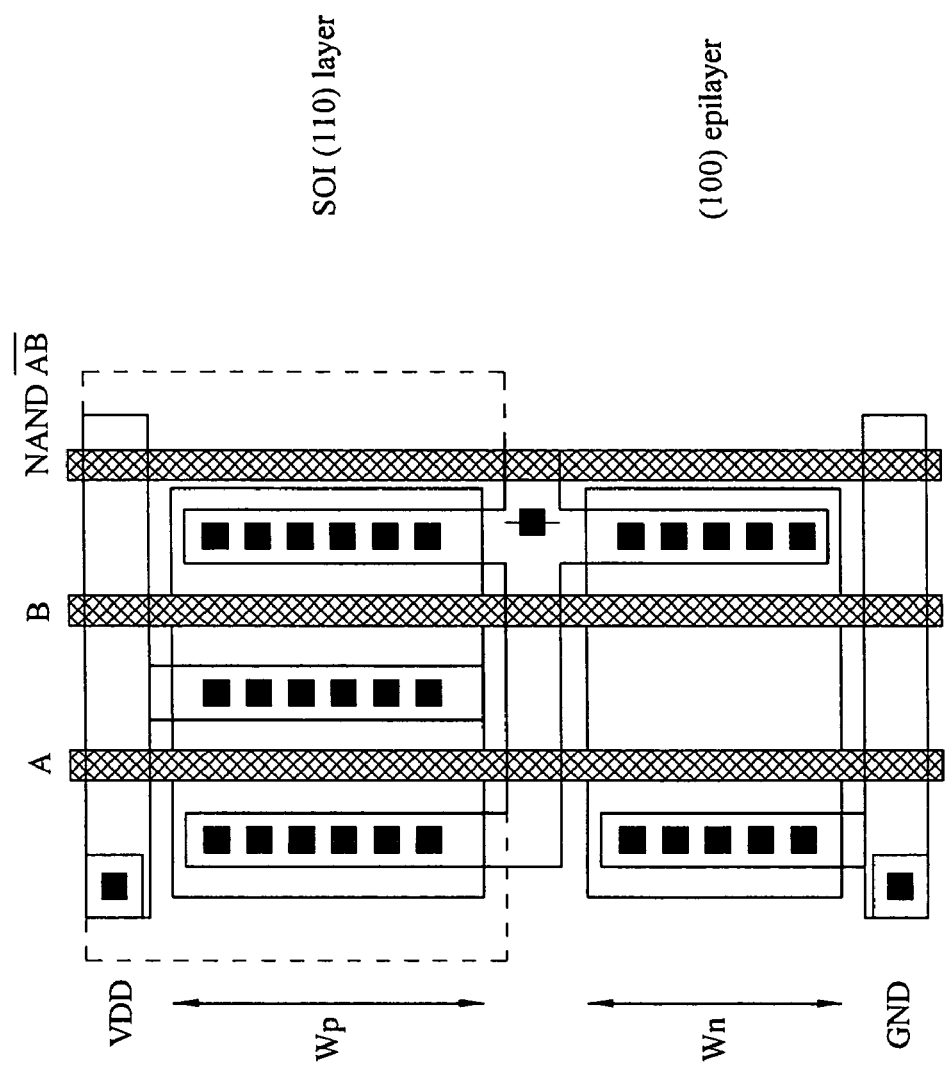
FIG. 5a is a plan view of a preferred embodiment of a core device area wherein a P-FET is fabricated on a (110) SOI silicon layer and a N-FET is fabricated on a (100) silicon epi-layer.
Figure 5B:
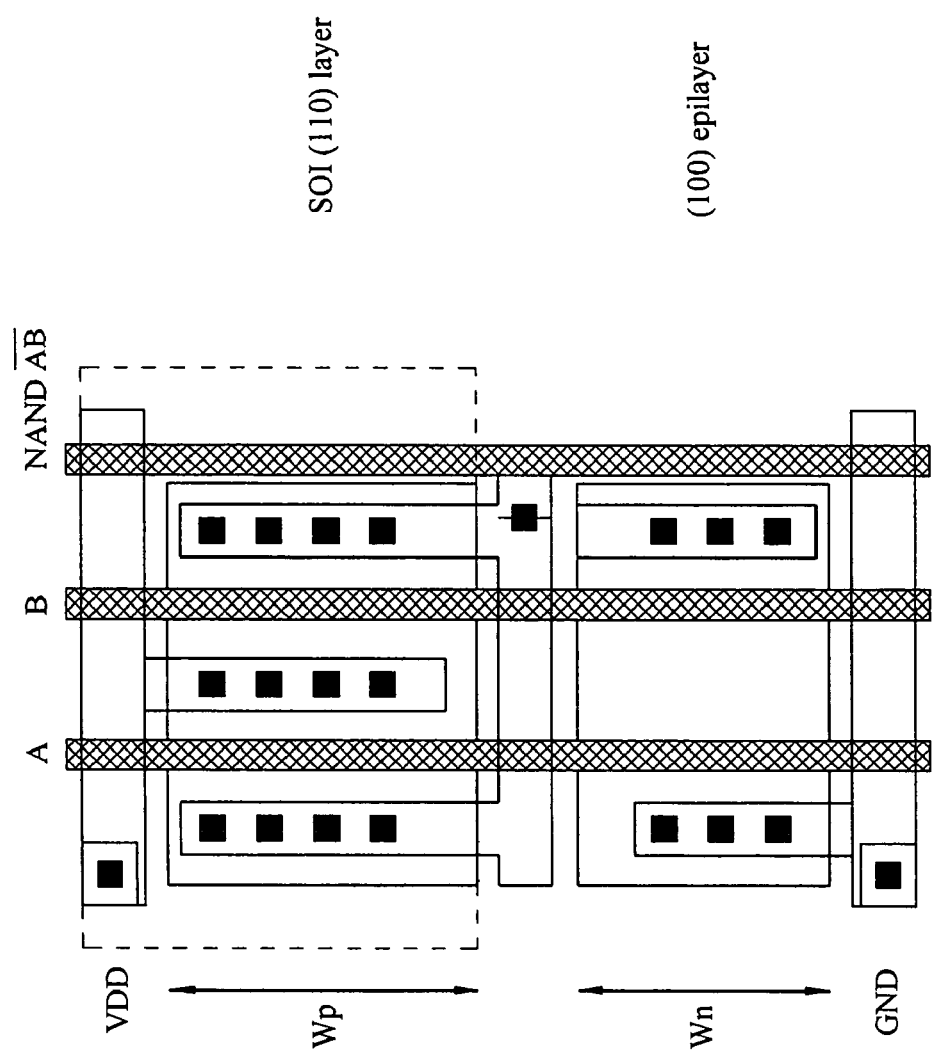
FIG. 5b is a plan view of a preferred embodiment of a non-core device wherein both P-FETs and N-FETs are fabricated on a (100) silicon substrate.

An alternative embodiment is illustrated using a plurality of NAND logic gates as an example. FIGS. 5a and 5b show a plan view of a plurality of NAND gates wherein the width of the total active area of a row of P-FETs is represented by $W_p$, and the width if the total active area of a row of N-FETs is represented by $W_n$. In core areas, i.e. areas wherein device density demands make real estate critical, hybrid orientation embodiments of the present invention are included. In non-core device areas, i.e. areas wherein device density is not so vital, devices may be formed using only a single crystal orientation.

Alternative embodiments, not illustrated, may further include gate dielectrics comprising metal oxides such as $Al_2O_3$, $ZrO_2$, $HfO_2$, $Y_2O_3$, $La_2O_3$, $TiO_2$, $Ta_2O_5$; silicates such as, ZrSiO4, ZrSiN, $HfO_2$, $HfSiO_4$, HfSiON, HfSiN; oxides such as $SiO_2$ and oxynitride. Yet other alternatives include metal gates comprising Ru, Ti, Ta, W, or Hf as a portion of the metal gate; metal nitride stacked gates; metal oxide gates such as $RuO_2$ or $IrO_2$; metal nitride gates such as MoN, WN, TiN, TaN, TaAlN; poly silicon; or poly SiGe gates. Alternative embodiments may also include gate silicide such as $CoSi_2$ or NiSi.

Preferred embodiments include $HfO_2$, $HfSiO_4$, HfSiON, HfSiN for gate dielectrics; poly-Si or fully Ni-silicided poly-Si for gate electrode; and TaSiN, TaN, MoN for the metal gate of N-FET; and Ru, WN, TaAlN for the metal gate of P-FET.

As discussed above, using only a single crystal orientation to fabricate both N-FETs and P-FETs on a (100) surface means only electrons achieve near maximum mobility. In order to overcome this limitation, manufacturers traditionally make $W_p > W_n$ to account for the poor hole mobility in P-FETs.

The preferred embodiment of FIGS. 5a and 5b illustrate a method for balancing P-FET optimization requirements of core regions with economics and complexity in non-core regions. Consequently, a preferred embodiment of the present invention comprises designing a NAND gate wherein $W_p/W_n$ of core areas is less than $W_p/W_n$ in non-core areas. In this way, additional processing steps associated with embodiments described herein are limited to core areas.

FIG. 5a is a plan view of a preferred embodiment of a core device area wherein a P-FET is fabricated on a (110) SOI silicon layer and a N-FET is fabricated on a (100) silicon epi-layer. In this configuration, both holes and electrons may exhibit maximum mobility when FET channels (not shown) are aligned in a <110> direction. In this case, as the preferred embodiment in FIG. 5a illustrates, $W_p$ may be approximately equal to $W_n$, as it is not necessary to adjust for poor hole mobility in this embodiment. This contrasts with the embodiment in FIG. 5b. FIG. 5b is a plan view of a preferred embodiment of a non-core device wherein both P-FETs and N-FETs are fabricated on a (100) silicon substrate. In this configuration, $W_p > W_n$ to account for the poor hole mobility in P-FETs.

The NAND gate illustrated in FIG. 5b, which may be formed in a peripheral region of the chip, has both P-FETs and N-FETs formed on a substrate having a single orientation. Because of significant improvement of P-FET current by hybrid orientation, smaller width of P-FET in the core region is expected to achieve a balanced CMOS, $V_{in}$–$V_{out}$ characteristics. Therefore, in preferred embodiments, the ratio of $W_p/W_n$ in core areas is less than that in non-core areas. The resulting NAND gate structure therefore saves valuable chip real estate.

Figure 6:
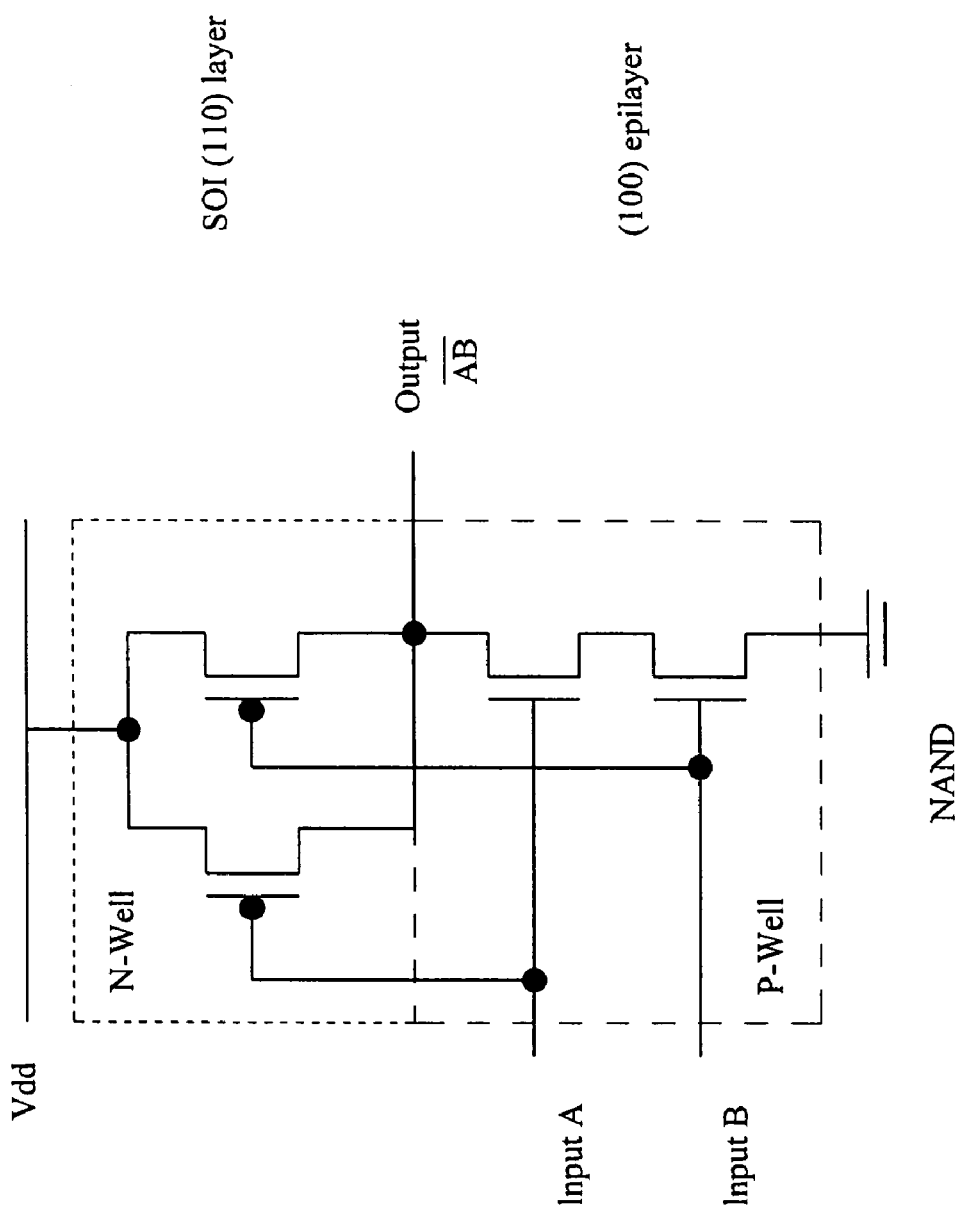
FIG. 6 is a circuit diagram of a preferred embodiment comprising a NAND gate.
Figure 7:
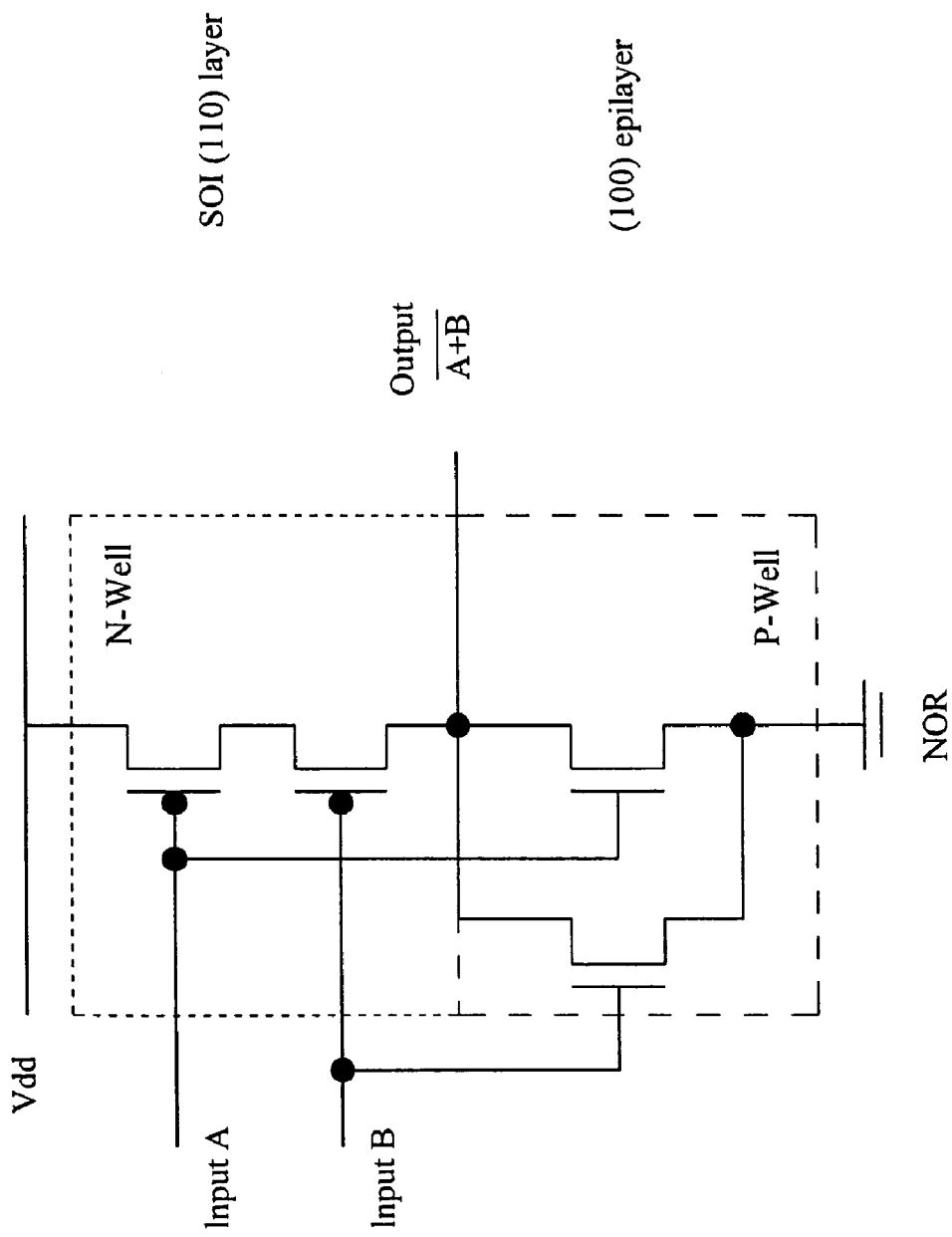
FIG. 7 is a circuit diagram of a preferred embodiment comprising a NOR gate.

FIG. 6 is a circuit diagram of a preferred embodiment comprising a single NAND gate. Included in the NAND gate are two N-FETs on a (100) epilayer, and two P-FETs on a (110) SOI layer. FIG. 7 is an alternative embodiment comprising a single NOR gate, wherein the FETs are similarly situated.

Although the present invention and its advantages have been described in detail, it will be readily understood by those skilled in the art that crystallographic orientations and directions may be varied while remaining within the scope of the present invention. For example, many of the features and functions regarding CMOS fabrication on SOI hybrid substrate orientations discussed above may be combined with other mobility enhancing methods.

One exemplary combination includes the addition of a stress-inducing film to SOI hybrid orientation embodiments. For example, those skilled in the art know that it is desirable to induce a tensile strain in the channel of n-channel transistors in the source to drain region. It is also desirable to induce a compressive strain in the channel of p-channel transistors in the same direction.

One problem that manufacturers face is knowing how to orient the transistors on SOI/epi-layer hybrid orientations. Alternative preferred embodiments provide a method for properly orienting the transistors.

When the strain is applied to both P-FETs and N-FETs with <110> channels, the N-FET and P-FET channels might be preferably non-parallel to avoid stress induced degradation in either N-FET or P-FET. This is due to the different piezoresistance coefficient stemming from different surface and channel orientations. It is known that tensile stress is beneficial for N-FET, but for P-FET, the compressive stress is preferred. Thus, choosing proper crystal orientations in which one is stress-sensitive and the other is stress-insensitive is a way to resolve this dilemma of strain effect on N-FET and P-FET. This is illustrated in FIG. 8, which shows preferred channel orientation for hybrid substrates.

Figure 8:
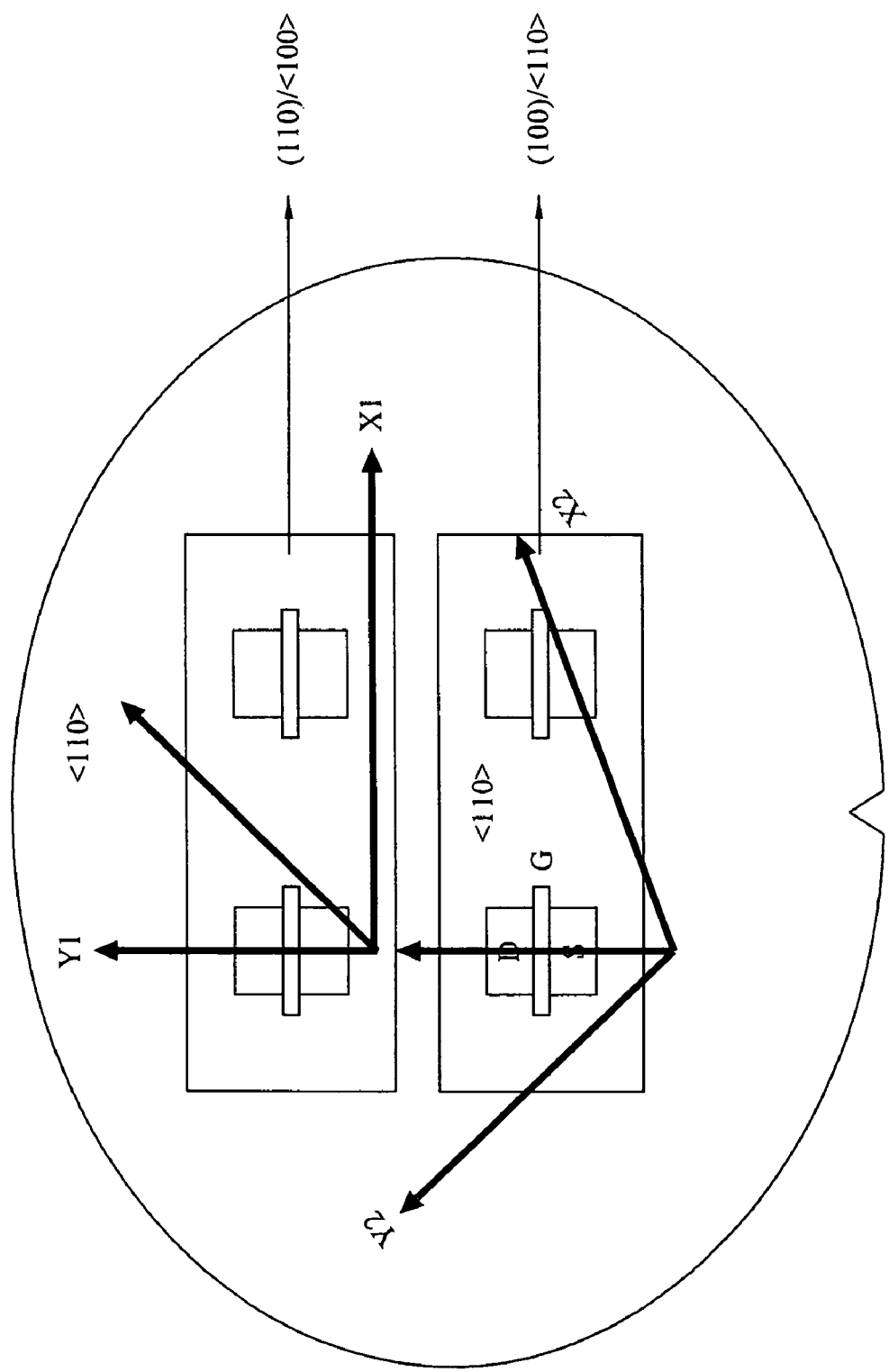
FIG. 8 is a plan view illustrating a preferred method for orienting P-FETs and N-FET on a SOI/epi-layer hybrid orientation substrate.

The embodiment of FIG. 8 shows hybrid orientations composed of (110)/<100> and (100)/<110> orientations (i.e. wafer surface orientation/gate direction). The piezoresistance coefficient on bulk p-type (110)/<100> orientation is much smaller than that in bulk n-type (100)/<110> orientation. These piezoreisitance coefficients on bulk n-type and p-type are used to simulate inversion mode N-FET and P-FET. That means P-FET is stress-insensitive to either tensile or compressive stress. For example, tensile stress can be applied to improve N-FET without degrading P-FET. It can simplify the process steps, i.e. no extra steps, such as Ge implant, are needed to remove the strain effect on P-FET.

Silicon tends to cleave along a plane having the lowest bonding density or bonding energy. The cleavage energy of a Si crystal along different orientations is: (100)>(110)>(111). In FIG. 8, the preferred cleavage plane, i.e. the energetically favored cleavage plane, of (110)/<100> orientation is (111), and the preferred cleavage plane of (100)/<110> is (110). Thus, in the hybrid structure embodiment of FIG. 8, the cleavage planes are preferably not parallel.

Therefore, in accordance with the embodiments described above and in FIG. 8, a method for orienting transistors on SOI/epi-layer hybrid orientations includes providing a substrate, wherein the substrate has at least a first region and a second region. The first region has a first crystal orientation, and the second region has a second crystal orientation, preferably different from the first crystal orientation. The embodiment further includes determining the preferred cleavage planes of the substrates and orienting the substrates relative to each other in view of their respective preferred cleavage planes. Another embodiment further includes orienting the first and second substrate so that their respective preferred cleavage planes are not parallel. Yet another embodiment may include a plurality of substrates and a plurality of crystal orientations wherein at least two crystal orientations are substantially not parallel. Still other embodiments may include devices formed according to embodiments described herein. Yet still other embodiments may further include a plurality of devices wherein the device gate electrodes are non-parallel and wherein the gate electrodes form an intersecting angle from about 5 to 85 degrees. In other embodiments, preferred cleavage planes of substrates having different orientations form an intersecting angle from about 5 to 85 degrees.

Although the present invention and its advantages have been described in detail, it should be understood that various changes, substitutions and alterations may be made herein without departing from the spirit and scope of the invention as defined by the appended claims. For example, many of the features and functions discussed above may be implemented with other semiconductor technology. Examples of other technologies combinable with embodiments include additional devices such as guard rings, scrap lines, seal rings, metal pads, bipolar transistors, or diodes on substrates of single orientation.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a plurality of substrates, the substrates having selected crystal orientations;
   a first plurality of FETs formed on substrates having at least two different crystal orientations; and
   a second plurality of FETs formed on a substrate having only one crystal orientation, wherein said second plurality of FETs formed on a substrate having only one crystal orientation includes a logic gate-comprising at least two N-FETs, wherein an active area ratio of a largest N-FET region to a smallest N-FET region is less than $10^5$.

2. The semiconductor device of claim 1 wherein a first one of the plurality of substrates has a first preferred cleavage plane, a second one of the plurality of substrates has a second preferred cleavage plane, and the first preferred cleavage plane is not parallel to the second preferred cleavage plane.

3. The semiconductor device of claim 2 wherein the first one of the plurality of substrates and the second one of a plurality of substrates collectively form a SOI substrate.

4. The semiconductor device of claim 2 wherein the first one of the plurality of substrates and the second one of a plurality of substrates are different materials.

5. The semiconductor device of claim 2 further comprising at least two I/O devices on substrates having the same orientation.

6. The semiconductor device of claim 2 further comprising at least two ESD devices on substrates having the same orientation.

7. The semiconductor device of claim 2 further comprising art additional device on substrates having a single orientation, wherein the additional device is selected from a group consisting of a guard ring, a scrap line, a seal ring, a bipolar transistor, and a diode, or combinations thereof.

8. The semiconductor device of claim 1 wherein the plurality of substrates further comprises a SOI substrate.

9. The semiconductor device of claim 1 wherein at least two substrates are different materials.

10. The semiconductor device of claim 1 further comprising at least two I/O devices on substrates having the same orientation.

11. The semiconductor device of claim 1 further comprising at least two ESD devices on substrates having the same orientation.

12. The semiconductor device of claim 1 further comprising an additional device on substrates having a single orientation, wherein the additional device is selected from a group consisting of a guard ring, a scrap line, a seal ring, a bipolar transistor, and a diode, or combinations thereof.

13. The semiconductor device of claim 1 wherein the plurality of substrates further includes preferred cleavage planes, and wherein at least two preferred cleavage planes are not parallel.

14. The semiconductor device of claim 1 wherein the first plurality of FETs are not parallel to the second plurality of FETs.

15. The semiconductor device of claim 14 wherein the first plurality of FETs and the second plurality of FETs have a relative orientation characterized by an intersecting angle, wherein the intersecting angle is about 5 to 85 degrees.

16. The semiconductor device of claim 1 wherein the logic gate further comprises at least one P-FET, the P-FET having a second crystal orientation.

17. The semiconductor device of claim 16 wherein the second crystal orientation is different from the first crystal orientation.

18. The semiconductor device of claim 1 wherein said first plurality of FETs fanned on substrates having at least two different crystal orientations includes:
a core device comprising a core N-FET having a core N-FET width, and a core P-FET having a core P-FET width; and
a non-core device formed on a single crystal orientation, the non-core device comprising a non-core N-FET having a non-core N-FET width, and a non-core P-FET having non-core P-FET width, wherein a ratio of core P-FET width to core N-FET width is less tan a ratio of non-core P-FET width to non-core N-FET width.

19. The semiconductor device of claim 18 wherein the plurality of substrates further comprises a SOI substrate.

20. The semiconductor device of claim 18 further comprising at least two I/O devices on substrates having the same orientation.

21. The semiconductor device of claim 18 further comprising at least two ESD devices on substrates having the same orientation.

22. The semiconductor device of claim 18 further comprising an additional device on substrates having a single orientation, wherein the additional device is selected from a group consisting of a guard ring, a scrap line, a seal ring, a bipolar transistor, and a diode, or combinations thereof.

23. The semiconductor device of claim 18 wherein the plurality of substrates further include preferred cleavage planes, wherein at least two preferred cleavage planes are not parallel.

24. A method for manufacturing a. semiconductor device, the method comprising:
forming a plurality of substrates having selected crystal orientations;
forming a first plurality of FETs on substrates having at least two different crystal orientations; and
forming a second plurality of FETs on a substrate having only one crystal orientation, wherein the forming a second plurality of FETs on a substrate having only one crystal orientation includes forming a logic gate on at least one substrate having a first crystal orientation, the logic gate further comprising at least two N-FETs, wherein an active area ratio of a largest N-FET region to a smallest N-FET region is less than $10^5$.

25. The method of claim 24 wherein at least one of the substrates comprises an epitaxial layer formed on the bulk silicon.

26. The method of claim 24 wherein forming a plurality of substrates having at least two different crystal orientations further comprises determining the preferred cleavage planes of the substrates and orienting the substrates relative to each other in view of their respective preferred cleavage planes.

27. The method of claim 26 wherein orienting the substrates relative to each other in view of their respective preferred cleavage planes further comprises orienting at least two preferred cleavage planes not parallel.

28. The method of claim 27 wherein orienting at least two preferred cleavage planes not parallel further includes orienting non-parallel cleavage planes at an angle between about 5 and 85 degrees.

29. The method of claim 24 further comprising forming an additional device on substrates having a single orientation, wherein the additional device is selected from a group consisting of a guard ring, a scrap line, a seal ring, a bipolar transistor, and a diode, or combinations thereof.

* * * * *